United States Patent
Koike et al.

(10) Patent No.: US 10,433,427 B2
(45) Date of Patent: Oct. 1, 2019

(54) METHOD FOR FIRING COPPER PASTE

(71) Applicant: Material Concept, Inc., Sendai-shi, Miyagi (JP)

(72) Inventors: Junichi Koike, Sendai (JP); Yuji Sutou, Sendai (JP); Daisuke Ando, Sendai (JP)

(73) Assignee: MATERIAL CONCEPT, INC., Sendai-Shi, Miyagi (JP)

( * ) Notice: Subject to any disclaimer, the term of this patent is extended or adjusted under 35 U.S.C. 154(b) by 0 days.

(21) Appl. No.: 15/319,549

(22) PCT Filed: Jun. 2, 2015

(86) PCT No.: PCT/JP2015/065933
§ 371 (c)(1),
(2) Date: Dec. 16, 2016

(87) PCT Pub. No.: WO2015/194366
PCT Pub. Date: Dec. 23, 2015

(65) Prior Publication Data
US 2017/0135221 A1    May 11, 2017

(30) Foreign Application Priority Data
Jun. 16, 2014    (JP) ................. 2014-123799

(51) Int. Cl.
*H05K 3/12*    (2006.01)
*B05D 3/04*    (2006.01)
(Continued)

(52) U.S. Cl.
CPC ............ *H05K 3/1291* (2013.01); *B05D 3/02* (2013.01); *B05D 3/04* (2013.01); *B22F 3/10* (2013.01);
(Continued)

(58) Field of Classification Search
CPC .................................................. H05K 3/1291
(Continued)

(56) References Cited

U.S. PATENT DOCUMENTS

| | | | |
|---|---|---|---|
| 4,140,817 A | | 2/1979 | Brown |
| 4,776,027 A | * | 10/1988 | Hisano ................. G05D 1/0246 382/288 |

(Continued)

FOREIGN PATENT DOCUMENTS

| | | |
|---|---|---|
| CN | 1792127 A | 6/2006 |
| GB | 1249493 A | 10/1971 |

(Continued)

OTHER PUBLICATIONS

Extended European Search Report issued to corresponding EP Application No. 15810529.6-1373/3153254 PCT/JP2015065933; dated Jun. 16, 2017.

(Continued)

*Primary Examiner* — Tabatha L Penny
(74) *Attorney, Agent, or Firm* — Cantor Colburn LLP

(57) ABSTRACT

To provide a method for firing a copper paste, which improves sinterability of copper particles for the purpose of forming a copper wiring line that is decreased in the electrical conductivity. A method for firing a copper paste, which comprises: an application step wherein a copper paste is applied over a substrate; a first heating step wherein the substrate is heated in a nitrogen gas atmosphere containing from 500 ppm to 2,000 ppm (inclusive) of an oxidizing gas in terms of volume ratio after the application step, thereby oxidizing and sintering copper particles in the copper paste; and a second heating step wherein the substrate is heated in a nitrogen gas atmosphere containing 1% or more of a (Continued)

reducing gas in terms of volume ratio after the first heating step, thereby reducing the oxidized and sintered copper oxide.

3 Claims, 1 Drawing Sheet

(51) Int. Cl.
    *B22F 3/10* (2006.01)
    *B05D 3/02* (2006.01)
    *H01B 1/22* (2006.01)
    *H01B 5/02* (2006.01)
    *H01B 5/14* (2006.01)
    *H01B 13/00* (2006.01)
    *H01L 21/48* (2006.01)
    *H01B 1/00* (2006.01)
    *B22F 1/00* (2006.01)

(52) U.S. Cl.
    CPC .......... *B22F 3/1007* (2013.01); *B22F 3/1017* (2013.01); *H01B 1/22* (2013.01); *H01B 5/02* (2013.01); *H01B 5/14* (2013.01); *H01B 13/00* (2013.01); *H01L 21/4867* (2013.01); *B22F 1/0048* (2013.01); *B22F 2001/0066* (2013.01); *B22F 2998/10* (2013.01); *B22F 2999/00* (2013.01); *H01B 1/00* (2013.01); *H05K 2203/1157* (2013.01); *H05K 2203/1476* (2013.01)

(58) Field of Classification Search
    USPC ...................................................... 427/376.1
    See application file for complete search history.

(56) References Cited

U.S. PATENT DOCUMENTS

| | | | | |
|---|---|---|---|---|
| 4,879,261 A | * | 11/1989 | Burn | B22F 1/0059 501/133 |
| 5,035,837 A | * | 7/1991 | Saeki | B22F 1/0059 106/1.13 |
| 5,682,018 A | * | 10/1997 | Wen | C04B 41/009 174/257 |
| 2006/0210705 A1 | | 9/2006 | Itoh | |
| 2014/0083753 A1 | | 3/2014 | Mataki | |

FOREIGN PATENT DOCUMENTS

| | | | | |
|---|---|---|---|---|
| GB | 2079322 A | | 1/1982 | |
| JP | H07022737 A | | 1/1995 | |
| JP | 07045931 A | | 2/1995 | |
| JP | 2002043747 | * | 2/2002 | ............... H05K 3/46 |
| JP | 2002043747 A | | 2/2002 | |
| JP | 2009231755 A | | 10/2009 | |
| JP | 2010018832 A | | 1/2010 | |
| JP | 2012204466 A | | 10/2012 | |

OTHER PUBLICATIONS

International Search Report corresponding to Application No. PCT/JP2015/065933; dated Sep. 1, 2015, with English translation.
Notice of Reasons for Rejection issued to JP Application No. 2014-123799, dated Dec. 16, 2014.

* cited by examiner

METHOD FOR FIRING COPPER PASTE

This is the U.S. national stage of application No. PCT/JP2015/065933, filed on Jun. 2, 2015. Priority under 35 U.S.C. § 119(a) and 35 U.S.C. § 365(b) is claimed from Japanese Application No. 2014-123799, filed Jun. 16, 2014, the disclosure of which is also incorporated herein by reference.

TECHNICAL FIELD

The present invention relates to a method for firing a copper paste applied to the substrate.

BACKGROUND ART

Conductive pastes are used for forming wiring on electronic components such as a chip resistor, a chip capacitor, and a solar battery, as well as on electronic package components such as a printed wiring board and a substrate having a through hole. Conductive pastes can be also used for electrode or wiring to be connected to a transistor for controlling pixel switching of a display. For most of the existing conductive pastes, a silver paste that is excellent in oxidation resistance is used. However, silver is expensive and, in addition, has a problem that migration failure easily occurs in fine-pitched wiring. Therefore, studies have been made for obtaining wiring structures with low resistance and high reliability by producing a copper paste using copper in place of silver and then firing the copper paste.

When a silver paste is fired in the air, a binder resin reacts with the air, and thereby the amount of resin that remains in the wiring after firing can be decreased as much as possible, and increase in wiring resistance due to remaining of resin can be suppressed. On the contrary, since copper is easily oxidized in atmosphere containing oxygen, the conductive copper paste needs to be fired in an inert gas or in a vacuum. In this case, there has been a problem that a binder resin component remains in a wiring due to oxygen deficiency, thus deteriorating the sinterability, resulting in increasing the wiring resistance. Furthermore, even when the copper paste is fired in an inert gas or in a vacuum, it has been difficult to properly suppress oxidation of copper particles, so that copper particles are oxidized at the time of firing and the wiring resistance tends to be increased.

As a method using inexpensive conductive paste of copper particles in place of expensive silver particles, for example, Patent Document 1 discloses a method for sintering while heating at not lower than a temperature at which resin is decomposed and disappears in the air, and reducing copper oxide powders produced at this time into copper. Patent Document 2 discloses a method for forming a sintered body by carrying out a de-binder step in a non-oxidizing atmosphere, and lowering the temperature in an oxidizing atmosphere to oxidize copper, and further reducing the copper. Patent Document 3 discloses a method in which the oxidation treatment is carried out at a temperature exceeding an oxidation start temperature, and the reduction treatment is carried out at a temperature not lower than the reduction start temperature. Patent Document 4 discloses a method for drying at a temperature less than 150° C., followed by pressurizing, heating, and carrying out reduction treatment.

Patent Document 1: Japanese Unexamined Patent Application, Publication No. H07-45931

Patent Document 2: Japanese Unexamined Patent Application, Publication No. 2002-43747

Patent Document 3: Japanese Unexamined Patent Application, Publication No. 2009-231755

Patent Document 4: Japanese Unexamined Patent Application, Publication No. 2012-204466

DISCLOSURE OF THE INVENTION

Problems to be Solved by the Invention

However, with the above-mentioned conventional methods, the degree at which a copper paste is fired and copper particles are sintered to become dense is not sufficient, and copper wiring having low electrical resistivity cannot be obtained. Therefore, a firing method for further improving the sinterability of copper particles has been demanded.

In view of such circumstances, the present invention has an object to provide a method for firing a copper paste, which improves the sinterability of copper particles in order to form copper wiring having low electrical resistivity.

Means for Solving the Problems

The present inventors have found that a substrate to which a copper paste is applied is subjected to a first heating step of heating in a certain oxidizing gas atmosphere and a second heating step of heating in a certain reducing gas atmosphere, so as to form a dense oxidized sintered body including copper oxide, and thereafter the sintered body is reduced to form a dense copper sintered body, resulting in enabling the electrical resistivity to be decreased. Thus, the present inventors have completed the present invention. Specifically, the present invention provides the following.

(1) A method for firing a copper paste, the method including an application step of applying a copper paste to a substrate; after the application step, a first heating step of heating the substrate in a nitrogen gas atmosphere containing 500 ppm or more and 2000 ppm or less of oxidizing gas in a volume ratio, and oxidizing and sintering copper particles in the copper paste; and after the first heating step, a second heating step of heating the substrate in a nitrogen gas atmosphere containing 1% or more reducing gas in a volume ratio, and reducing the oxidized and sintered copper oxide.

(2) The firing method described in the above (1), wherein the first heating step is carried out at 350° C. or more and 500° C. or less.

(3) The firing method described in the above (1) or (2), wherein the second heating step is carried out at 400° C. or more and 550° C. or less.

(4) The firing method described in any one of the above (1) to (3), wherein the first and second heating steps maintain the gas atmosphere by allowing gas to continuously flow in a firing furnace.

(5) The firing method described in the above (4), wherein a flow rate of the continuously flowing gas is 0.05 liter/min or more and 0.5 liter/min or less with respect to a volume of the firing furnace, 1×10-6 m3.

(6) The firing method described in any one of the above (1) to (5), wherein oxide of copper particles formed in the first heating step includes cuprous oxide and cupric oxide, and heating is carried out such that an amount of the cuprous oxide is larger than an amount of the cupric oxide.

(7) A sintered structural body formed by the firing method described in any one of the above (1) to (6), wherein the sintered structural body after the first heating step includes a structure in which adjacent particles are connected to each other by volume expansion during oxidation.

(8) A sintered structural body formed by the firing method described in any one of the above (1) to (6), wherein the sintered structural body includes a structure in which copper particles are linked to each other by reduction of cuprous oxide and cupric oxide in the second heating step.

Effects of the Invention

Since the present invention provides a firing method for densely sintering copper particles of a copper paste applied to the substrate, it is possible to decrease the electrical resistivity of the copper wiring on the substrate.

PREFERRED MODE FOR CARRYING OUT THE INVENTION

Figure 1:
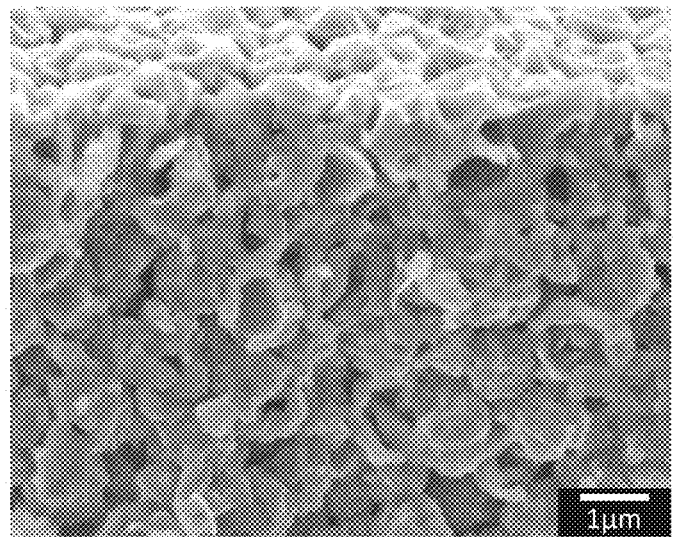
FIG. 1 is a view showing a cross-sectional microstructure of a test sample after a first heating step in Example 1.

Hereinafter, an embodiment of the present invention will be described. The present invention is not construed to be limited to the description. The present invention provides a method for firing a copper paste, and the method includes a step of applying a copper paste to a substrate; a first heating step of heating the applied substrate in a nitrogen gas or inert gas atmosphere containing 500 ppm or more and 2000 ppm or less of oxidizing gas in a volume ratio and oxidizing and sintering copper particles in the copper paste; and after the first heating step, a second heating step of heating the substrate in a nitrogen gas or inert gas atmosphere containing 1% or more reducing gas in a volume ratio, and reducing the oxidized and sintered copper oxide.

Substrate

The firing method of the present invention is applicable to a substrate on which copper wiring is formed. Examples of the substrate include a substrate on which an electronic package component is to be mounted, a printed wiring board, a substrate having a through hole, and the like. Examples of materials for the substrate include oxide substrates such as a silicon substrate, silicate glass, alumina, and quartz; nitride substrates such as silicon nitride, and aluminum nitride; carbide substrate such as silicon carbide and titanium carbide; a resin substrate, and the like.

Copper Particle

A copper paste is prepared by mixing copper particles, a binder resin, a solvent, and the like.

The copper particles contained in the copper paste have an oxygen concentration in the particles is 0.05 mass % or more and 2.0 mass % or less. More preferably, the upper limit of the concentration is only required to be 1.0 mass % or less. When the oxygen concentration is more than 2.0 mass %, the oxidation degree of metallic particles becomes remarkable, and the metallic particles have a stronger tendency to be aggregated in the copper paste, thus deteriorating the printing property. Furthermore, even with the later firing, metal oxide is not sufficiently reduced, and therefore wiring resistance after firing is increased. On the other hand, it is desirable that the oxygen concentration is as low as possible, but the oxygen concentration of less than 0.05 mass % in the metallic particles produced by, for example, an atomization method is not preferable because treatment in reduced gas is needed and cost is increased.

The total concentration of the metallic elements other than copper contained in the particles is suppressed to 1.0 mass % or less and more preferably 0.8 mass % or less.

It is preferable that the copper particles are produced by a gas atomization method, a water atomization method, or the like. The average value of the aspect ratio (dmax/dmin) defined as a ratio of the maximum diameter (dmax) to the minimum diameter (dmin) of particle may be 1.0 or more and less than 2.2, and is preferably 1.0 or more and 2.0 or less. The average aspect ratio of the copper particle is more than 2.2, a particle shape becomes a flat flake shape or a needle shape, thus causing clogging at the time of screen printing. Furthermore, the filling rate of copper particles in the wiring after printing is deteriorated to cause the wiring shape to hang. At the same time, increase of the porosity deteriorates the sinterability to thus increase the wiring resistance after firing.

Binder Resin

Mass percent of a binder resin in an organic vehicle contained in a conductive paste is preferably more than 0.05% and less than 17.0%. The binder resin may be any resins as long as it is decomposed by firing. Examples thereof include cellulose resins such as methyl cellulose, ethyl cellulose, and carboxymethyl cellulose, acrylic resin, butyral resin, alkyd resin, epoxy resin, phenol resin, and the like. Among them, cellulose resins which tend to react with a small amount of oxygen or a small amount of carbon monoxide contained in the firing atmosphere and easily disappear from the paste is preferably used. Among the cellulose resins, ethyl cellulose is further preferably used.

Solvent

A solvent contained in the conductive paste is not particularly limited as long as it has proper boiling point, vapor pressure, and viscosity. Examples of the solvent include a hydrocarbon solvent, a chlorinated hydrocarbon solvent, a cyclic ether solvent, an amide-based solvent, a sulfoxide solvent, a ketone solvent, an alcohol based compound, a polyhydric alcohol ester solvent, a polyhydric alcohol ether solvent, a terpene solvent, and mixture thereof. Among them, texanol, butyl carbitol, butyl carbitol acetate, and terpineol having a boiling point of about 200° C. is preferably used.

Application Method

A binder resin and a solvent are mixed with each other, then, copper particles are further added to the mixture, and the mixture is kneaded using a device such as a planetary mixer. Furthermore, 10% or less glass frit in mass ratio with respect to the mass of copper particles may be added. Furthermore, if necessary, a method for enhancing dispersion of particles using a three-roll mill may be employed.

The conductive paste is printed on a substrate by a method such as a screen printing method so as to produce a wiring shape. Thereafter, the resultant product is fired in a gas atmosphere to sinter copper particles to obtain wiring.

First Heating Step

In the first heating step, the substrate on which a copper paste has been applied is heated in a nitrogen gas atmosphere containing an oxidizing gas. This heating is a process for carrying out evaporation of a solvent, combustion and elimination of resin, and oxidizing and sintering of copper particles. As the above-mentioned oxidizing gas, oxygen can be used, and the concentration of the oxidizing gas is preferably 500 ppm or more and 2000 ppm or less in a volume ratio. When the concentration of the oxidizing gas is less than 500 ppm, combustion of resin is not sufficiently carried out, and a resin component remains, thus deteriorating the sinterability. When the concentration is more than 2000 ppm, reaction rapidly proceeds only in the vicinity of the surface of the copper paste to form a dense sintered coated layer, thus hindering the reaction inside. In order for combustion and elimination of resin and oxidizing and sintering of copper particles to proceed uniformly in the entire paste, the oxygen concentration is preferably 500 ppm or more and 2000 ppm or less.

Heating temperature is preferably 350° C. or more and 500° C. or less. When the heating temperature is less than 350° C., resin remains, and when the heating temperature is more than 500° C., the coating layer is formed, thus hindering the reaction inside.

Second Heating Step

The second heating step is a process in which a sintered body including copper oxide, which has been formed in the first heating step, is subjected to reduction treatment in a nitrogen gas atmosphere containing a reducing gas and is heated so as to obtain a sintered body including copper. As the above-mentioned reducing gas, hydrogen, carbon monoxide, formic acid, ammonium, and the like, can be used. When the concentration of the reducing gas is less than 1% in a volume ratio, reduction of the copper oxide in the sintered body is not sufficiently carried out and copper oxide remains, and therefore the copper wiring after being fired has high electrical resistivity. Therefore, it is preferable that the concentration of the reducing gas is 1% or more in a volume ratio.

Heating temperature is preferably 400° C. or more and 550° C. or less. When the heating temperature is less than 400° C., copper oxide remains. When the heating temperature is more than 550° C., reaction between the sintered body and the substrate occurs, and therefore the copper wiring after firing has high electrical resistivity.

Gas Atmosphere

In each of the first and second heating steps, a substrate to which a copper paste has been applied is held and heated in a predetermined gas atmosphere. For example, heating can be carried out in a state in which the substrate is disposed in a firing furnace. The gas atmosphere in the firing furnace may be heated in a closed environment in which gas having a predetermined composition is filled, or may be heated in a gas flowing environment. As the gas to be filled or to flow, gas prepared by mixing oxygen gas or a reducing gas with the nitrogen gas so as to have a predetermined concentration can be used.

In the first heating step, the resin contained in the copper paste is burned and disappears. When combustion gas generated at that time resides in the vicinity of the substrate, the combustion reaction is prevented and resin remains. Furthermore, in the second heating step, due to the residing combustion gas, the reduction of copper oxide may stop on the surface portion of the sintered body. In order to eliminate such a generated combustion gas, it is preferable that the gas atmosphere is maintained by allowing gas for atmosphere to continuously flow. The gas flow rate is preferably 0.05 liter/min or more and 0.5 liter/min or less with respect to a volume of the firing furnace, 1×10-6 m3. When the gas flow rate is less than 0.05 liter/min, the combustion reaction does not proceed sufficiently. When the gas flow rate is more than 0.5 liter/min, the substrate temperature is changed, thus making it difficult to control the heating temperature.

Sintered Structural Body

Copper particles in a copper paste are oxidized by oxidation in the first heating step, and cuprous oxide (Cu2O) is formed in a continuous shape so as to cover the copper particle surface. When the copper particles are changed into cuprous oxide, since about 60% volume expansion occurs, adjacent particles can adhere closely to each other to be sintered. Consequently, a sintered structural body in which adjacent particles are connected to each other can be obtained without pressurization at high temperature, and thus excellent sinterability is achieved. Thereafter, the sintered structural body is reduced in the second heating step, resulting in obtaining a dense sintered structural body in which copper particles are linked to each other. Thus, copper wiring having low electrical resistivity is obtained. For the percentage of the oxide, it is preferable that 70% or more of the volume of copper particles are oxidized because a dense sintered structural body is formed when the copper particles are oxidized to such a degree.

On the other hand, oxidation further proceeds and cupric oxide (CuO) is formed, since the cupric oxide has a needle shape, the formation of dense sintered body tends to be hindered. Therefore, it is not preferable that cupric oxide is increased due to excessive oxidation. The amount of cuprous oxide contained in the particles in the sintered structural body after the first heating step is preferably larger than that of the cupric oxide, and more preferably, the amount of cuprous oxide occupies 65% or more in the copper oxide.

EXAMPLES

Hereinafter, the present invention is described in more detail with reference to Examples, but the present invention is not construed to be limited to these Examples.

Example 1

A copper paste was printed in a shape of wiring on a glass substrate having a size of 20 mm×20 mm and a thickness of 0.6 mm by a screen printing method on the surface to obtain a test sample with a copper paste having a thickness of about 20 μm. The test sample was placed in a firing furnace, followed by heat treatment at 400° C. for 5 minutes as a first heating step. In this heat treatment, as a gas atmosphere in the firing furnace, a nitrogen gas atmosphere in which the oxygen contents were changed variously, or an air atmosphere were used. Then, heat treatment at 500° C. for 5 minutes was carried out as a second heating step. In this heat treatment, for the gas atmosphere in the firing furnace, a nitrogen gas atmosphere containing 5% hydrogen gas in a volume ratio was used. In both first and second heating steps, heat treatment was carried out while predetermined gas was allowed to flow at a flow rate of 0.1 liter/min with respect to a volume of the firing furnace, 1×10-6 m3. After heat treatment, the temperature was cooled to room temperature, the test sample was taken out from the firing furnace, and subjected to measurement of electrical resistivity and observation of a cross-sectional microstructure.

Electrical Resistivity

Electrical resistivity of copper wiring of a test sample was measured by a direct current four-probe method. Four needle-shaped electrodes (probes), which were disposed at a distance interval of 1 mm in the longitudinal direction of the copper wiring, were pressed into contact, then, an electric current (I) was allowed to flow between the two probes at the outer sides, and a potential difference (V) between the two probes at the inner sides was measured, and the electrical resistivity ($\rho$) was calculated from $\rho=(V/I)\times S \times C$. Herein, C denotes correction coefficient relating to the shape of the copper wiring, and C was made to be 4.532. A height of cross section of the wiring (S) was obtained by observing the cross section of the wiring with a scanning electron microscope. The test samples having the electrical resistivity of 6 μΩcm or less were determined to be acceptable. Measurement results of the electrical resistivity are shown in Table 1.

TABLE 1

| Oxygen concentration (ppm) | 100 | 300 | 500 | 1000 | 2000 | 5000 | 10000 | Air |
|---|---|---|---|---|---|---|---|---|
| Electrical resistivity (μΩcm) | 13.2 | 7.3 | 5.1 | 3.8 | 4.9 | 6.1 | 8.2 | 19.5 |

As shown in Table 1, in the gas atmosphere in the first heating step, when the oxygen concentration was 500 ppm or more and 2000 ppm or less in a volume ratio, copper wiring having low electrical resistivity of 6 μΩcm or less was obtained. On the contrary, when the oxygen concentration was less than 500 ppm or more than 2000 ppm, the electrical resistivity was more than 6 μΩcm. When the oxygen concentration was too small, combustion of resin was insufficient and the resin component remained. On the other hand, when the oxygen concentration was too large, reaction proceeded rapidly and a coating layer was formed, thus deteriorating the sinterability. Therefore, in any case, it was difficult to form a dense sintered body, and the electrical resistivity was increased. In particular, when the oxygen concentration was as low as 100 ppm or less and when the oxygen concentration was as high as that in the air, the electrical resistivity was more than 10 μΩcm.

Cross-Sectional Microstructure

A test sample heated in a gas atmosphere having an oxygen concentration of 1000 ppm in Table 1 was subjected to observation of the cross-sectional microstructure of the test sample with a scanning electron microscope (SEM). FIG. 1 is a photograph of a cross-sectional microstructure of the test sample after heating in the first heating step. As shown in FIG. 1, by oxidation treatment in the above-mentioned gas atmosphere, a dense sintered structure in which particles containing copper oxide adhered closely to each other was obtained. Copper oxide including cuprous oxide was formed on the surface of copper particle.

Figure 2:
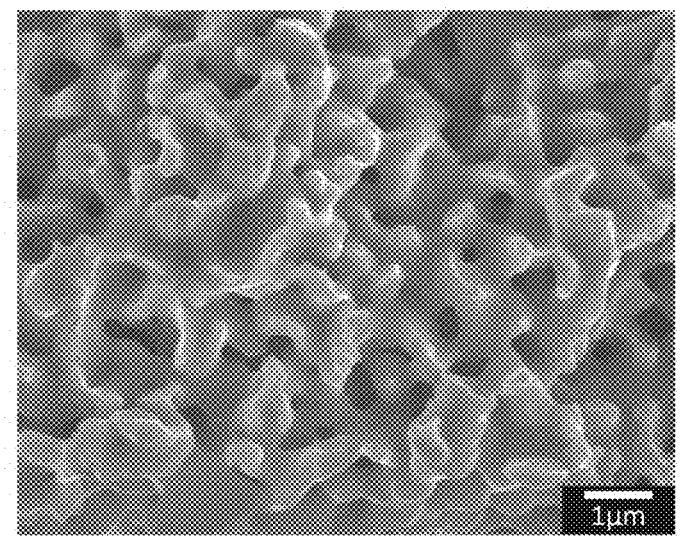
FIG. 2 is a view showing a cross-sectional microstructure of the test sample after a second heating step in Example 1.

FIG. 2 is a photograph of a sectional structure of the test sample after heating in the second heating step. As shown in FIG. 2, a dense sintered structure, in which the sintered structure of FIG. 1 was reduced and copper particles were linked to each other, was formed. It is assumed that formation of such a sintered structure gives low electrical resistivity.

Herein, it was demonstrated that the sintered structure included copper oxide, by a structure observation performed under an SEM and by a composition analysis using an X-ray energy dispersive spectrometer attached to the SEM. Furthermore, containing ratios of copper and copper oxide, and ratios of cuprous oxide and cupric oxide in the copper oxide were demonstrated also by a structural analysis by an X-ray diffraction method. The ratio of copper oxide was 87% in a volume ratio. The ratio of cuprous oxide in the copper oxide was 91%.

Example 2

Heat treatment of the first and second heating steps was carried out by the same procedures as in Example 1 except that the heating temperature (T1) in the first heating step was changed variously to produce a test sample, and the electrical resistivity of the test sample was measured. The first heating step was carried out at the oxygen concentration of 1000 ppm. Measurement results are shown in Table 2.

TABLE 2

| T1 (° C.) | 280 | 320 | 350 | 380 | 420 | 470 | 500 | 530 | 560 |
|---|---|---|---|---|---|---|---|---|---|
| Electrical resistivity (μΩcm) | 17.9 | 11.8 | 5.8 | 4.2 | 3.9 | 4.0 | 5.3 | 7.0 | 8.2 |

As shown in Table 2, when the heating temperature in the first heating step was 350° C. to 500° C., copper wiring having low electrical resistivity of 6 μΩcm or less was obtained. On the contrary, when the heating temperature was less than 350° C. or more than 500° C., the electrical resistivity was more than 6 μΩcm. When the heating temperature was too low, resin remained. When the heating temperature was too high, a coating layer was formed, thus hindering the internal reaction, so that the sinterability, was deteriorated. Therefore, in any case, it was difficult to harm a dense sintered body, and the electrical resistivity of copper wiring was increased.

Example 3

Heat treatment of the first and second heating steps was carried out by the same procedures as in Example 1 except that the heating temperature (T2) in the second heating step was changed variously to produce a test sample, and the electrical resistivity of the test sample was measured. The first heating step was carried out at the oxygen concentration of 1000 ppm. Measurement results are shown in Table 3.

TABLE 3

| T2 (° C.) | 300 | 350 | 400 | 450 | 500 | 550 | 600 | 650 | 700 |
|---|---|---|---|---|---|---|---|---|---|
| Electrical resistivity (μΩcm) | 16.4 | 12.8 | 5.4 | 4.7 | 3.8 | 5.0 | 7.7 | 9.1 | 25.4 |

As shown in Table 3, when the heating temperature n the second heating step was 400° C. to 550° C., copper wiring having low electrical resistivity of 6 μΩcm or less was obtained. On the contrary, when the heating temperature was less than 400° C. or more than 550° C., the electrical resistivity was as high as more than 6 μΩcm. When the heating temperature was too low, copper oxide remained; and when the heating temperature was too high, reaction occurs between the sintered body and the substrate, and the electrical resistivity of copper wiring was increased.

Example 4

The heat treatment of the first and second heating steps was carried out by the same procedures as in Example 1 except that the gas flow rates in the first and second heating steps were changed variously to produce a test sample, and the electrical resistivity of the test sample was measured. The first heating step was carried out at the oxygen concentration of 1000 ppm. Measurement results are shown in Table 4.

TABLE 4

| Gas flow rate (liter/min) | 0 (Sealed) | 0.05 | 0.1 | 0.3 | 0.5 | 0.7 | 0.9 |
|---|---|---|---|---|---|---|---|
| Electrical resistivity (μΩcm) | 6.2 | 4.7 | 3.8 | 4.1 | 5.3 | 7.5 | 10.7 |

As shown in Table 4, when the gas flow rate was from 0.5 liter/min to 0.5 liter/min inclusive with respect to a volume of the firing furnace, 1×10-6 m3, copper wiring having low electrical resistivity of 6 μΩcm or less was obtained. When the gas flow rate was less than 0.05 liter/min or more than 0.5 liter/min, the electrical resistivity was as high as more than 6 μΩcm. When the gas flow rate was too small, the combustion reaction did not proceed sufficiently, and when the gas flow rate was too large, the change in temperature became large, so that it became difficult to form a dense sintered structure, and the electrical resistivity of copper wiring was increased.

The invention claimed is:

1. A method for firing a copper paste, the method comprising:

an application step of applying a copper paste to a substrate, the copper paste comprising copper particles, a binder resin, and a solvent;

after the application step, a first heating step of heating the substrate at 350° C. or more and 500° C. or less in a nitrogen gas atmosphere containing 500 ppm or more and 2000 ppm or less of oxidizing gas in a volume ratio, and oxidizing and sintering the copper particles in the copper paste; and after the first heating step, a second heating step of heating the substrate at 400° C. or more and 550° C. or less in a nitrogen gas atmosphere containing 1% or more reducing gas in a volume ratio, and reducing the oxidized and sintered copper oxide, wherein a mass percent of the binder resin in an organic vehicle contained in the copper paste is more than 0.05% and less than 17.0%, wherein the binder resin is one or more selected from a group consisting of cellulose resin, acrylic resin, butyral resin, alkyd resin, epoxy resin and phenol resin, wherein the copper particles in the copper paste are oxidized by oxidation in the first heating step, and cuprous oxide is formed in a continuous shape so as to cover the copper particle surface, and wherein the oxide of copper particles formed by the first heating step includes cuprous oxide and cupric oxide, and heating is carried out such that an amount of the cuprous oxide is larger than an amount of the cupric oxide, wherein an electrical resistivity of a copper wiring obtained after the second heating step is 6 μΩcm or less.

2. The firing method according to claim 1, wherein the first and second heating steps maintain the gas atmosphere by allowing gas to continuously flow in a firing furnace.

3. The firing method according to claim 2, wherein a flow rate of the gas which is allowed to continuously flow is 0.05 liter/min or more and 0.5 liter/min or less with respect to a volume of the firing furnace, $1 \times 10^{-6}$ m$^3$.

* * * * *